(12) United States Patent
Brown et al.

(10) Patent No.: US 6,383,923 B1
(45) Date of Patent: May 7, 2002

(54) ARTICLE COMPRISING VERTICALLY NANO-INTERCONNECTED CIRCUIT DEVICES AND METHOD FOR MAKING THE SAME

(75) Inventors: Walter L. Brown, Berkeley Heights; Sungho Jin, Millington; Wei Zhu, Warren, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/643,784

(22) Filed: Aug. 22, 2000

Related U.S. Application Data (62) Division of application No. 09/426,457, filed on Oct. 5, 1999.

(51) Int. Cl.[7] .............................................. H01L 21/44
(52) U.S. Cl. ...................... 438/666; 438/734; 438/962
(58) Field of Search ................................ 438/666, 962; 257/734

(56) References Cited

U.S. PATENT DOCUMENTS

| | | | |
|---|---|---|---|
| 6,159,831 A | * | 10/1998 | Thrush et al. |
| 6,129,901 A | * | 11/1998 | Moskovits et al. |
| 5,926,951 A | * | 7/1999 | Khandros et al. |
| 6,228,241 B1 | * | 5/2001 | Alwitt et al. |
| 6,231,744 B1 | * | 5/2001 | Ying et al. |

FOREIGN PATENT DOCUMENTS

DE 198 52 585 A1 * 11/1998

OTHER PUBLICATIONS

Routkevitch et al., Nonlithographic Nano–Wire Arrays, IEEE, vol. 43, No. 10, Oct. 1996.*
Saito, Carbon Nanotubes for Next–Generation Electronics devices, Science, vol. 278, Oct. 3, 1997.*
Liu et al., Science, Washington, May 22, 1998, vol. 280, pp. 1253–1256.*

* cited by examiner

*Primary Examiner*—George Fourson
*Assistant Examiner*—Thanh V Pham
(74) *Attorney, Agent, or Firm*—Lowenstein Sandler PC

(57) ABSTRACT

A circuit device is disclosed comprising at least two circuit layers or circuit devices vertically interconnected with a plurality of parallel and substantially equi-length nanowires disposed therebetween. The nanowires may comprise composites, e.g., having a heterojunction present along the length thereof, to provide for a variety of device applications. Also disclosed is a method for making the circuit device comprising growing a plurality of nanowires on a dissolvable or removable substrate, equalizing the length of the nanowires (e.g., so that each one of the plurality of nanowires is substantially equal in length), transferring and bonding exposed ends of the plurality of nanowires to a first circuit layer; and removing the dissolvable substrate. The nanowires attached to the first circuit layer then can be further bonded to a second circuit layer to provide the vertically interconnected circuit device.

14 Claims, 6 Drawing Sheets

ARTICLE COMPRISING VERTICALLY NANO-INTERCONNECTED CIRCUIT DEVICES AND METHOD FOR MAKING THE SAME

This application is a divisional of U.S. patent application Ser. No. 09/426,457 filed by Walter Brown et al. on Oct. 5, 1999 and entitled "Article Comprising Vertically Nano-Interconnected Circuit Devices and Method for Making the Same", which is incorporated herein by reference.

This application is related to U.S. patent application Ser. No. 09/405,641, now U.S. Pat. No. 6,286,226, titled "Tactile Sensor Comprising Nanowires and Method for Making the Same," filed Sep. 24, 1999, by inventor Jin herein, and U.S. patent application Ser. No. 09/643,784, titled "In-Situ Nano-interconnected Circuit Devices and Method for Making the Same," filed concomitantly herewith, by inventors Brown, Jin and Zhu herein.

FIELD OF THE INVENTION

This invention relates to structures for making nano-interconnected or nano-packaged circuits and methods of making same, and more particularly, to vertical electrical connection of circuits using conductive nanowires.

BACKGROUND OF THE INVENTION

Nano-scale wires such as carbon nanotubes with a very small size scale, on the order of 1–100 nanometers in diameter and 0.1–100 $\mu$m in length, have received considerable attention in recent years. See Liu et al., SCIENCE, Vol. 280, p. 1253 (1998), Ren et al., SCIENCE, Vol. 282, p. 1105 (1998); Li et al., SCIENCE, Vol. 274, p. 1701 (1996); Frank et al., SCIENCE, Vol. 280, p. 1744 (1998); J. Tans et al., NATURE, Vol. 36, p. 474 (1997); Fan et al., SCIENCE, Vol. 283, p. 512 (1999); Collins et al., SCIENCE, Vol. 278, p. 100 (1997); Kong et al., NATURE, Vol. 395, p. 878 (1998); and Ebbesen et al., NATURE, Vol. 382, p. 54 (1996).

Carbon nanotubes exhibit unique atomic arrangements, nano-scale structures and interesting physical properties such as one-dimensional electrical behavior, quantum conductance, and ballistic transport characteristics. The ballistic transport in carbon nanotubes, as reported by Frank et al, allows the passage of huge electrical currents in electronic circuits, with the magnitude of current density comparable to or better than those in some superconductors. Carbon nanotubes are one of the smallest dimensioned nanowire materials with generally high aspect ratio and small diameter of ~1 nm in the case of single-wall nanotubes and less than ~50 nm in the case of multi-wall nanotubes. See Rinzler et al, APPLIED PHYSICS, Vol. A67, p. 29 (1998); Kiang et al, J. PHYSICAL CHEM., Vol. 98, p. 6612 (1994), and Kiang et al, PHYSICAL REVIEW LETTERS, Vol. 81, p. 1869 (1998).

High-quality single-walled carbon nanotubes are typically grown as randomly oriented, needle-like or spaghetti-like, tangled nanotubes by laser ablation or arc techniques (a chemical purification process is usually needed for arc-generated carbon nanotubes to remove non-nanotube materials such as graphitic or amorphous phase, catalyst metals, etc). Chemical vapor deposition (CVD) methods such as used by Ren et al., Fan et al., and Li et al tend to produce multiwall nanotubes attached to a substrate, often with a semi-aligned or an aligned, parallel growth perpendicular to the substrate. As described in these articles, catalytic decomposition of hydrocarbon-containing precursors such as ethylene, methane, or benzene produces carbon nanotubes when the reaction parameters such as temperature, time, precursor concentration, flow rate, are optimized. Nucleation layers such as a thin coating of Ni, Co, Fe, etc. are often intentionally added to the substrate surface to nucleate a multiplicity of isolated nanotubes. Carbon nanotubes can also be nucleated and grown on a substrate without using such a metal nucleating layer, e.g., by using a hydrocarbon-containing precursor mixed with a chemical component (such as ferrocene) which contains one or more of these catalytic metal atoms. During the chemical vapor decomposition, these metal atoms serve to nucleate the nanotubes on the substrate surface. See Cheng et al., CHEM. PHYSICS LETTERS, Vol. 289, p. 602 (1998).

The modern trend in electronic circuit design, interconnection and packaging is toward use of finer features, such that submicron feature sizes have been reached in recent years. To produce desired, ultra-high density electronic packaging, a small width of the circuit lines is important, as well as a three-dimensional, multi-layer configuration with vertically integrated circuit layers. However, nanowires grown with presently-available methods are not suitable for such purposes. The as-grown single-wall nanotubes (SWNT) such as commonly synthesized by laser ablation or arc method, have a spaghetti-like configuration and often are tangled with each other. The multi-wall nanotubes (MWNT), such as commonly made by chemical vapor deposition, are easier to prepare in an aligned and parallel configuration. However, these as-grown nanotubes such as reported by Ren et al. and Li, et al. differ in height or length. For reliable circuit interconnections without electrical shorts or opens, it is desirable to prepare nanowires having equal and specific predetermined lengths. Further, it would be advantageous to provide the nanowires as free-standing wires so that they may be manipulated, e.g., for transfer, placement and bonding for circuit interconnections at ambient or relatively low temperatures, e.g., below 300° C. Selective CVD growth of nanowires such as carbon nanotubes directly on desired circuit pads may be possible using selective area patterning of a catalyst layer; however, often it is undesirable to expose the delicate semiconductor circuits and components to the high temperatures (e.g., 600–1000° C.) and chemical environments involved with CVD deposition of nanotubes. The invention discloses substantially equal length nanowires that may be fabricated as free-standing units suitable for convenient vertical interconnections and vertically interconnect circuit devices using such nanowires.

SUMMARY OF THE INVENTION

The invention comprises a vertically-interconnected circuit device having at least two circuit layers and a plurality of substantially equi-length nanowires disposed therebetween. The nanowires may comprise composites, e.g., having a heterojunction present along the length thereof, to enable a number of device applications. Also disclosed is a method for making the circuit device comprising growing a plurality of nanowires on a removable substrate, equalizing the length of the nanowires (e.g., so that each one of the plurality of nanowires is substantially equal in length), transferring and bonding exposed ends of the plurality of nanowires to a first circuit layer; and removing the substrate. The nanowires attached to the first circuit layer can be further bonded to a second circuit layer to provide the vertically-interconnected circuit device.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale. Like reference numerals are used in the figures to refer to like features.

DETAILED DESCRIPTION OF THE INVENTION

This application discloses methods for preparing electrically-conducting nanowires such as carbon nanotubes that are useful as nano-scale, vertically connecting wires between circuit device layers and for in-plane connecting wires between adjacent electrical contact pads. For circuit interconnections, such as between two circuit layers or mating devices, the use of many, sub-divided parallel conductive paths can be achieved with aligned nanowires. The nanowires provide elastic compliance and flexibility of the interconnection medium which are advantageous in avoiding short and long-term reliability problems, e.g., caused by undesirable stresses. Common sources of stresses exerted on the interconnection medium include local temperature gradients, stresses arising from mismatches of the thermal expansion coefficients between different materials used in the devices, and electromigration-induced stresses, and mechanical and thermal stresses introduced during device assembly, handling, testing, or shipping. The invention avoids or minimizes the reliability problems caused by such stresses including fatigue, creep, or deformation failures of the interconnection medium or circuit components. When small-diameter nanowires are utilized, this invention is useful for achieving high- or ultra-high density circuit interconnections.

Referring to the figures, FIGS. 1A–1D schematically illustrate various configurations of nanowires grown on a substrate 10. The nanowires may comprise carbon nanotubes; semiconductor nanowires fabricated, for example, with Si, Ge, or GaAs; or nanowires fabricated with any other conductive or nonconductive materials known in the field, such as metals, alloys, oxides, carbides, nitrides, borides, or mixed ceramics. Methods for fabricating the nanowires may comprise laser ablation, arc discharge, or chemical vapor deposition of a precursor gas or mixture of precursor gases. Small diameter nanowires may be nucleated and grown upward from the substrate by catalytic decomposition of a gas phase. In this case, a catalytic film may be deposited on the substrate and fine-scale, local nucleation of this film may be initiated with catalytic decomposition in a gas phase. For example, a glass circuit substrate may be provided, a catalytic film comprising a transition metal may be deposited on the glass substrate, and then carbon nanotubes may be fabricated by decomposing $C_2H_4$ on the film surface. The catalytic film is also referred to herein as the catalytic nucleation film; it may be comprised of Ni, Co, or Fe, or other materials known in the field.

Figure 1A:
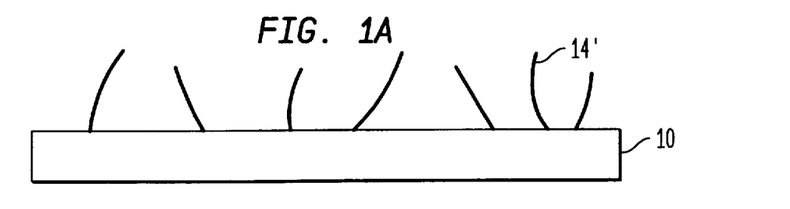
FIGS. 1A–1D schematically illustrate various configurations of nanowires grown on a substrate.
Figure 1B:
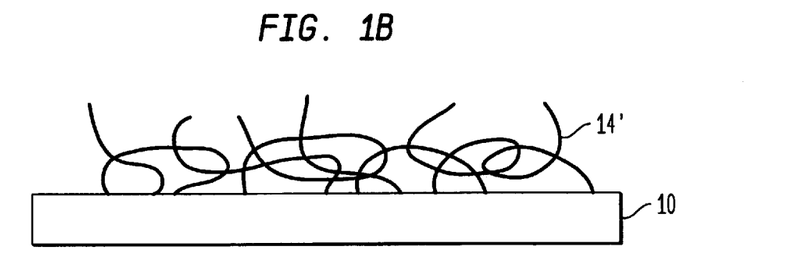

In the absence of alignment processing, the nanowires tend to grow as randomly-oriented or tangled nanowires 14', as shown in FIGS. 1A and 1B, respectively. A tangled morphology of nanowires 14' (FIG. 1B), also may be obtained with use of laser ablation. However, advantageously for the use in vertical interconnections, the nanowires are substantially vertically aligned. The nanowires may be aligned as they are fabricated, e.g., by using an applied electrical field, gas concentration gradient, or temperature gradient. Also, the nanowires may be aligned as grown by physical techniques using recessed vertical cavities in the substrate or by crowding, e.g., simultaneously fabricating a "dense forest" of nanowires (e.g., a high concentration per unit area). A porous ceramic or silicon layer may be used in combination with a catalytic nucleation film to enhance aligned growth of the nanowires. The aligned nanowires may be of a non-uniform length 14", as in FIG. 1C, or of a uniform length 14, as in FIG. 1D. The embodiment shown in FIG. 1D is preferred, that is, where the nanowires are substantially aligned and substantially equal in length. The length of each of the nanowires preferably deviates from the average nanowire length by less than 20% and more preferably by less than 10%.

The nanowires 14 advantageously are vertically aligned relative to the substrate and disposed substantially in parallel. Full vertical alignment of the nanowires (e.g., where in FIG. 1D angle $\phi$ between the surface 11 of the substrate and the length of the nanowire is 90°) is not necessary. However, preferably the deviation from complete vertical alignment is insubstantial, that is, it is less than about 25 degrees and preferably less than 15 degrees from full (90°) alignment.

Figure 2:
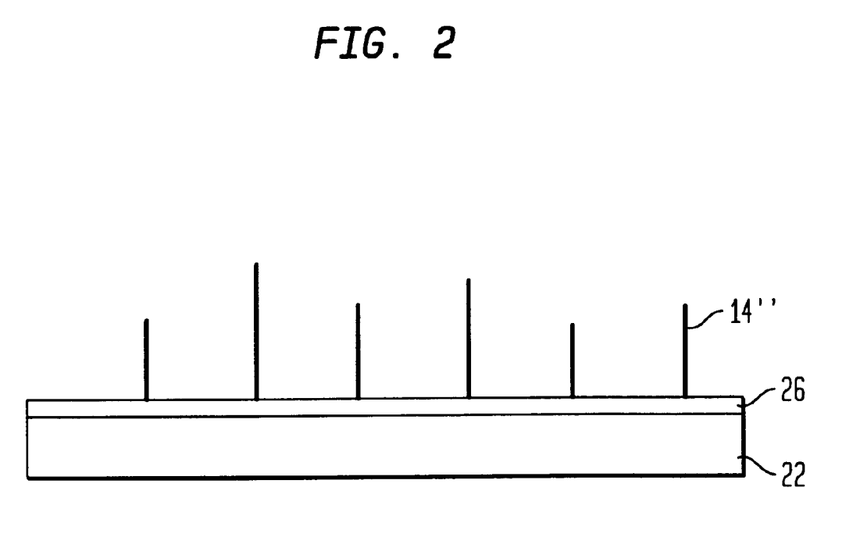
FIG. 2 schematically illustrates nanowires grown on a dissolvable substrate useful in making the vertically interconnected devices.

For ease of use in making vertical interconnections, the nanowires may be grown on a separate substrate that is dissolvable. For example, FIG. 2 shows unequal length vertically aligned nanowires 14" on a dissolvable substrate 22, grown with use of a catalytic nucleation layer 26. The dissolvable substrate aids in transferring the nanowires in making circuit interconnections, as explained below. The dissolvable substrate layer may be dissolvable in water, acid, base, or solvents. For example, sodium chloride crystal may be used to fabricate a water-soluble substrate. To fabricate an acid-dissolvable substrate, metals such as Cu, Ni, Co, Mo, Fe, V, Au, Ag, or their alloys may be used. To fabricate a base-dissolvable substrate, metals such as Al may be used. The substrate should be chosen so that the temperature of nanowire growth, e.g., by CVD processing, is below the melting point of the substrate material used. Alternatively, dissolvable polymer materials may be used to fabricate the separate substrate layer, such as polyvinyl alcohol, polyvinyl acetate, polyacrylamide, acrylonitrile-butadiene-styrene, or volatile (evaporable) materials such as polymethylmethacrylate (PMMA). When polymers are used, the temperature used in processing the nanowires should be sufficiently low to avoid damaging the polymer, such as through decomposition, change in physical shape, or change in chemical properties. A combination of materials also may be used to fabricate the dissolvable substrate layer. The dissolvable substrate may be coated with the catalytic nucleation film 26 (e.g., Ni, Fe, or Co) to grow the nanowires. After the nanowires are grown, the dissolvable layer can be removed. The catalytic nucleation film may be deposited on the dissolvable layer as a continuous layer or in a spotted or patterned manner, e.g., by sputtering, evaporation, or electrochemical deposition.

Figure 1C:
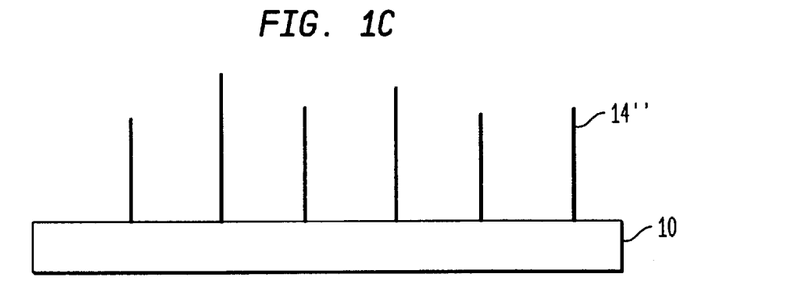
Figure 1D:
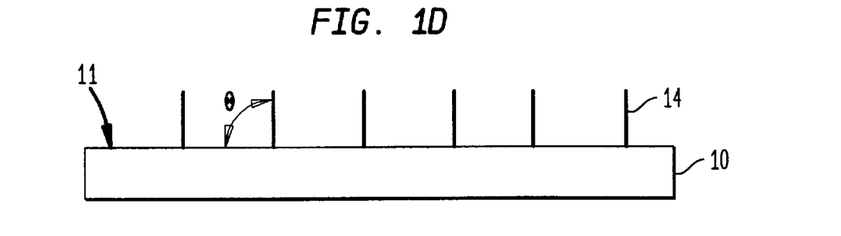
Figure 3A:
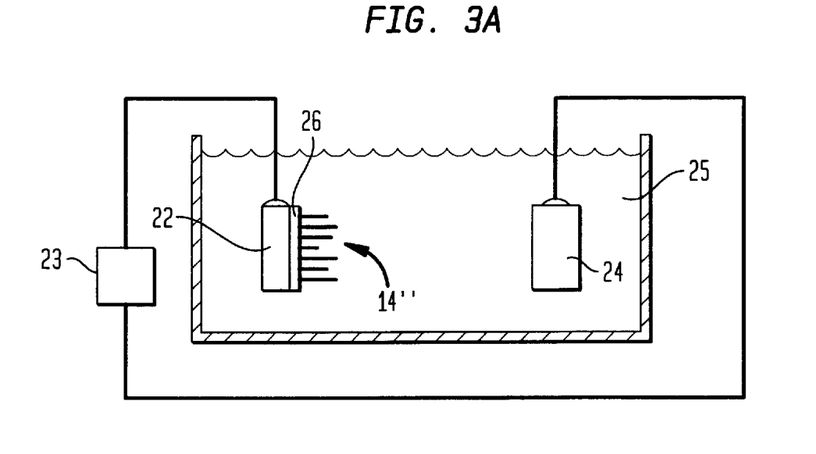
FIGS. 3A–3D schematically illustrate an exemplary process for equalizing nanowires to substantially the same length.
Figure 3B:
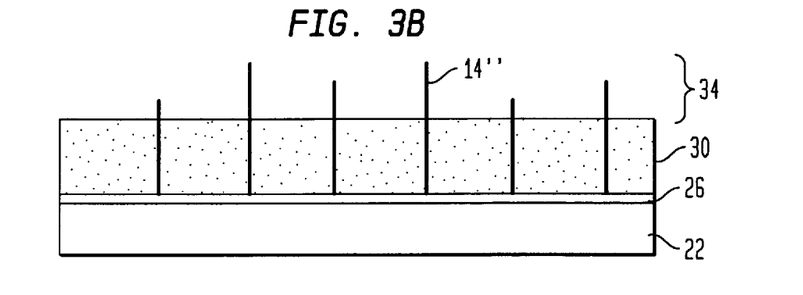

Nanowires may be first grown of unequal length, as shown in FIGS. 1C and 2, and then an equalization process applied to achieve substantially equal length nanowires, as shown in FIG. 1D. As mentioned, substantially equal-length nanowires are preferred. See, for example, U.S. patent application Ser. No. 09/354,928, "Nanoscale Conductive Connectors and Method for Making Same," filed Jul. 15, 1999, by Choi and Jin, inventors herein, assigned to the present assignee and incorporated herein by reference. An example of an equalization process is schematically illustrated with reference to FIGS. 3A–3D. The equalization process of this example comprises essentially three steps, i.e. (1) embedding unequal length nanowires in a dissolvable sacrificial layer 30 having a substantially uniform thickness (FIGS. 3A–3B); (2) removing an extra length 34 of nanowires protruding from the sacrificial layer (FIG. 3C); and (3) removing the sacrificial layer (FIG. 3D). Of course, it is understood that other equalization processes in the field may be used, such as laser cutting and hot blade cutting. See, e.g., U.S. patent application Ser. No. 09/236,933 filed on Jan. 25, 1999 by Jin, Zhu et al, two inventors herein, assigned to the present assignee and incorporated herein by reference.

In the exemplary process of FIGS. 3A–3D, the first step involves depositing a sacrificial layer of substantially uniform thickness. FIG. 3A shows an electroplating apparatus and process for depositing the sacrificial layer 30 on a substrate 22 having unequal length nanowires 14". In this example, a copper (Cu) dissolvable substrate layer 22 is provided, on which is deposited a catalytic nucleation layer 26 of nickel (Ni) having a thickness of about 1–100 nm. Of course, other materials as aforementioned may be used for the dissolvable substrate layer 22 or nucleation layer 26. The nucleation layer 26 is shown in the figures as a continuous layer. However, the nucleation layer (e.g., even when deposited as a continuous layer) may break up into segments or islands when heated, e.g., during chemical vapor deposition and nanowire growth. Such segmentation of the nucleation layer leaves the surface of the dissolvable substrate between nanowires depleted, without an overlying conducting metal film. Depending on the materials comprising the dissolvable substrate, it may be difficult to coat the substrate and segmented nucleation layer with a metallic sacrificial layer 30 (FIG. 3C, described below), such as, for example, where the dissolvable substrate is insulating (e.g., comprised of sodium chloride). Thus, a non-catalytic conductive underlayer (not shown) may first be deposited on the dissolvable substrate before the nucleation layer is deposited. In other words, in FIG. 2, an underlayer may be interposed between the dissolvable substrate 22 and the nucleation layer 26. This underlayer may be comprised of Mo or other non-catalytic conductive materials known in the field.

The Cu substrate layer 22 functions as a cathode in this process; it is positioned in a bath of electrolytic material 25 adjacent an anode 24 (e.g., of nickel) and coupled with the anode through power supply 23. The electrolyte 25 contains ions of the metal to be deposited, e.g., Ni from a solution containing $NiSO_4$ or Cu from a solution of $CuSO_4$. Preferably, the electrolyte bath 25 contains the same type of ions as those of the nucleation layer 26 or conductive underlayer. In this way, electrodeposition of the sacrificial layer 30 will occur on the surface of the nucleation layer 26 instead of on the nanowires 14", such as carbon or silicon nanowires, due to chemical affinity, e.g., the sacrificial layer 30 has the same metallic characteristics as the nucleation layer and substantially different characteristics from the nanowires. The sacrificial layer is deposited to a thickness that is substantially the same as the desired length of the nanowires. This parameter (nanowire length) will depend on the desired application for the sensor, but typically it will be in the range of 1 to 100 micrometers, as mentioned above. The thickness of the sacrificial layer may be controlled with processing variables, such as time, temperature, electrolyte concentration, current density, and so forth. Of course, FIG. 3A reflects one exemplary method for depositing the sacrificial layer. The sacrificial layer can be deposited by other methods, such as electroless plating, chemical vapor deposition, or physical vapor deposition, including sputtering, evaporation, laser ablation, or ion beam deposition.

FIG. 3B shows the structure obtained via the electrodeposition process of FIG. 3A comprising the dissolvable substrate layer 22; the nucleation layer 26; and the unequal length nanowires 14" embedded in the sacrificial layer 30 of substantially uniform thickness. The nanowires 14" each have an exposed extra-length portion 34 protruding beyond the sacrificial layer 30. The sacrificial layer 30 temporarily protects the buried nanowires while the extra-length portion 34 is removed. The sacrificial layer desirably is comprised of an easily-removable material, e.g., one that is removable by dissolving it in water or a solvent, by chemical or electrochemical etching, or by vaporizing through heating. Examples of suitable water-soluble or solvent-soluble materials include salts such as sodium chloride, silver chloride, potassium nitrate, copper sulfate, and indium chloride, or organic materials such as sugar and glucose. Examples of suitable chemically-etchable materials include metals and alloys such as Cu, Ni, Fe, Co, Mo, V, Al, Zn, In, Ag, Cu—Ni, and Ni—Fe. Sacrificial layers formed of these materials may be dissolved away in an acid such as hydrochloric acid, aqua regia, or nitric acid, or in a base solution such as sodium hydroxide or ammonia. Suitable vaporizable materials include those that exhibit high vapor pressure such as Zn, or which can be decomposed or burned away by heat treatment in a suitable oxidizing, reducing, or neutral gas atmosphere, such as organic acids.

Figure 3C:
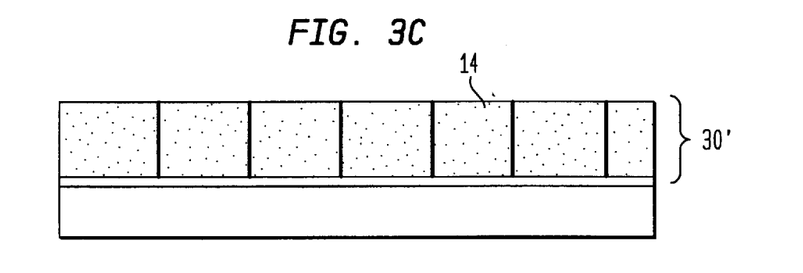
Figure 3D:
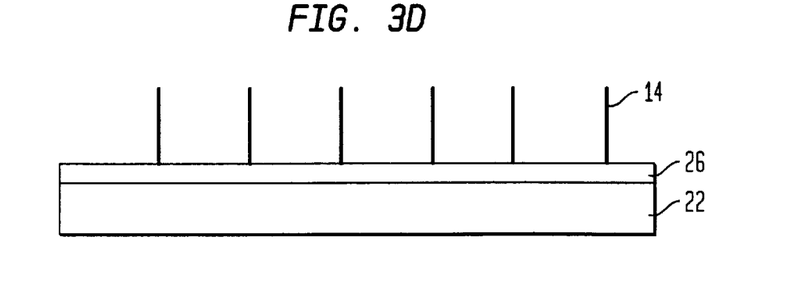

A next step of the equalization process involves removing the exposed portions 34 of the nanowires to obtain the equi-length nanowires 14 embedded in the sacrificial layer 30', as shown in FIG. 3C. Polishing or etching the exposed portions 34, e.g., by chemical or mechanical methods may perform this removal. Heating also may be used, which is preferred when carbon nanowires are used. For example, the extra-length portion 34 may be removed by heating the structure in an oxidizing atmosphere, e.g., at temperatures in the range of 200 to 1000° C. A full or partial oxygen or ozone atmosphere may be used. Alternatively, mechanical polishing may be used to remove the extra length of the nanowires. In the next step, the sacrificial layer 30' having equal length nanowires (FIG. 3C) is removed, e.g., by being dissolved away. The structure of FIG. 3D is thus achieved, having the substrate 22, nucleation layer 26, and substantially equal-length nanowires 14.

In removing the sacrificial layer 30', the nucleation layer 26 should remain on the dissolvable substrate 22, because otherwise, the nanowires may detach from the substrate 22. If the sacrificial layer comprises a non-metallic layer such as sodium chloride, copper sulfate, or polyvinyl alcohol, the sacrificial layer may be removed with the nucleation layer remaining in tact. However, if the sacrificial layer comprises a metal layer, removal of the sacrificial layer, such as by acid etch, may result in removal of the nucleation layer, such that the nanowires are detached from the substrate. To address this situation, the sacrificial layer may be partially etched (e.g., to one-half or one-third its original thickness), to expose a sufficient length of the nanowires for connecting the exposed ends of the nanowires to a circuit device. In this case, the remaining sacrificial layer may be removed later, e.g., when the dissolvable substrate and nucleation layer are removed. Advantageously, the dissolvable substrate is coated with a temporary protective layer (not shown) to protect it (e.g., from deformation, from being dissolved, etc.) during intermediate processing steps. The protective layer may be applied to the back and/or sides of the dissolvable substrate. It may comprise a lacquer-type material that is easily removed with solvents (e.g., alcohol or acetone) but stable in aqueous solutions. The materials comprising the dissolvable substrate 22, nucleation layer 26 and sacrificial layer 30 may be selected so that they have sufficient differential etching or removal rates to avoid dissolving the nucleation layer with removal of the sacrificial layer and/or to avoid damage to the dissolvable substrate during processing.

The equi-length parallel nanowires held by the dissolvable substrate (e.g., as in FIG. 3D) are useful for a variety of device applications, including vertical nano-scale circuit interconnections and tactile sensor devices, as described in U.S. application Ser. No. 09/405,641, now U.S. Pat. No. 6,286,226, filed Sep. 24, 1999 by inventor Jin, which is incorporated herein by reference. Advantageously for certain applications, at least a portion of the nanowires may be coated with a thin film or coating 36 of an electrically conductive and preferably bondable (solderable) metal or alloy (e.g., FIGS. 4A–4C). Optionally an adhesion-promoting layer (not shown) may be deposited between the coating 36 and the nanowire 14. Metallizing the nanowires may be helpful to ensure that there is electrical conduction along the length of the nanowires. The coating 36 may be applied to at least a portion of the nanowires and comprise a thin film of electrically conductive and preferably bondable (solderable) metal or alloy, for example, a solderable metal film such as Au, Ag, Pd, Rh, Ni, Cu, In, Sn, or a solder alloy film such as Au—Sn, Sn—Ag, Pb—Sn, Bi—Sn, In—Sn, or In—Ag. In the case of carbon nanotubes or nitride-type nanowires, the adhesion-promoting interface layer between the coating and nanowire may comprise a carbide- or nitride-forming element (e.g., Ti, Mo, Nb, V, Fe, W, Zr). The solderable layer as well as the adhesion-promoting layer can be added onto the nanowire surface by a number of processing approaches such as physical vapor deposition (sputtering, evaporation, ion-beam deposition), chemical vapor deposition, electroless or electrolytic deposition, or a combination of deposition techniques. Alternatively, the adhesion-promoting element may be pre-incorporated into the solder or solderable coating layer itself as an alloying element. To further promote the adhesion between the nanowire surface and the deposited adhesion-promoting layer, or between the adhesion-promoting layer and the solderable layer, an optional adhesion-enhancing heat treatment may be added, e.g., at about 100–900° C. for 0.1 to 100 hours, in an inert or vacuum atmosphere.

Figure 4A:
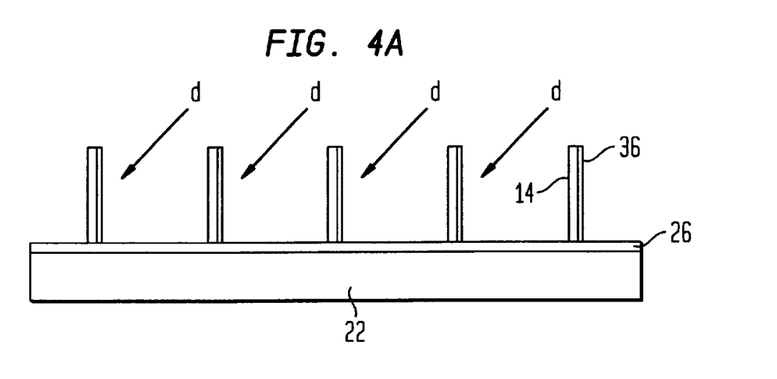
FIGS. 4A–4C show various configurations for the deposition of metallic coatings on nanowires.
Figure 4B:
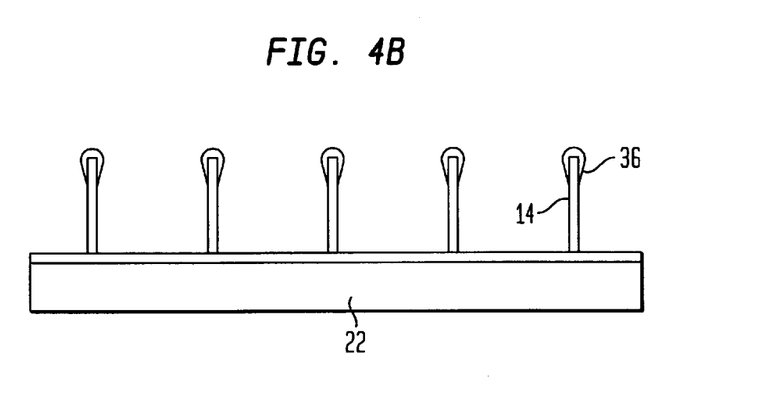
Figure 4C:
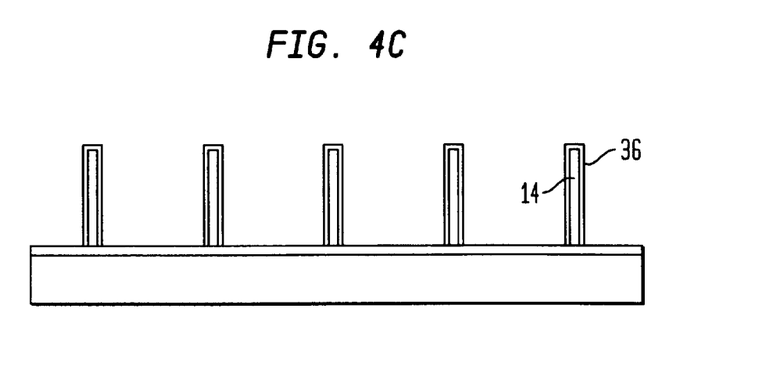

FIGS. 4A–4C illustrate the metallic coating 36 as applied with various techniques. FIG. 4A, for example, shows a line-of-sight deposition of metal atoms via physical vapor deposition. The deposition is performed along a lateral direction, e.g., following arrows "d", such that the metal is concentrated on one side of the nanowires. A more uniform deposition over the surface of the nanowires can be obtained by a modified process, e.g., by rotating the substrate during the deposition. An electrochemical method for depositing the metal (for example, electrolytic or electroless deposition) can produce a preferentially localized deposition as shown in FIG. 4B. This preferential deposition can occur due to a generally higher electrolyte concentration or higher (concentrated) current density near the tips of the nanowires. A non-uniform profile also may be obtained with CVD processing, with the uniformity of the coating dependent on various processing parameters, such as the speed at which the metal ions travel, the gas atom transfer to the deposition site, and the speed at which the coating is deposited. Slower and more controlled deposition processing can result in metallic coatings 36 of substantially uniform thickness along the length of the nanowires, as shown in FIG. 4C. The desirable thickness of the metallic or solderable layer as well as the interface adhesion-promoting layer (if needed) is typically in the range of 0.5–50 nanometers, and preferably is in the range of 1–20 nanometers.

The metallic film coated on the nanowires may serve several important functions.

i) It provides solderability for attaching the nanowires to the circuit substrate. A solderable metal or solder alloy coating is desirably also added to the surface of the electrical contact pads onto which the nanowires are to be bonded.

ii) It may impart a uniform electrical conductivity especially to nonmetallic nanowires, e.g., to semiconducting carbon nanotubes, semiconductor nanowires such as Si or Ga—As, or insulating nanowires such as $Al_2O_3$, $SiO_2$, BN, or other insulating ceramic nanowires. In fabricating efficient and reliable vertical interconnections, a stable electrical continuity from one end of the nanowire bonded to a bottom circuit device, through the nanowire length, and to the other end of the nanowire bonded to an upper device or the upper circuit layer is important. Single-wall nanotubes can be metallic with the "armchair" configuration of carbon atoms or semiconducting to near insulating with the "zig-zag" type configuration or certain "chiral" configurations. See Dresselhous et al., *Science of Fullerines and Carbon Nanotubes*, Chap. 19 (Academic Press, San Diego 1996), at pp. 758, 805–809. It is also known that the nanotube atomic arrangements and hence electrical properties may vary drastically along the length of a single carbon nanotube. See Collins et al., SCIENCE, Vol. 278, p. 100 (Oct. 3, 1997). Such a variation in electrical properties may adversely effect the efficient electron transport between nano-interconnected devices via the carbon nanotube interconnection medium. The metal surface coating on the nanowires as herein described addresses this problem and provides the desired electrical conductivity to the vertical nano-interconnection medium.

iii) The coating can also provide corrosion/oxidation resistance to the solderable coating (and also to the nanowires themselves if they are susceptible to corrosion/oxidation) upon exposure to ambient or processing atmospheres. Noble metal films such as Au, Ag, Pd, Rh, and so forth can be utilized either as the coating itself or as an added overcoating on top of the solderable metal coating 36 deposited on the nanowire. A thin overcoating of noble metal such as Au can be easily absorbed into the underlying molten solder, e.g. Au—Sn or Pb—Sn eutectic solder, during the soldering process and thus does not prevent the bonding.

Figure 5A:
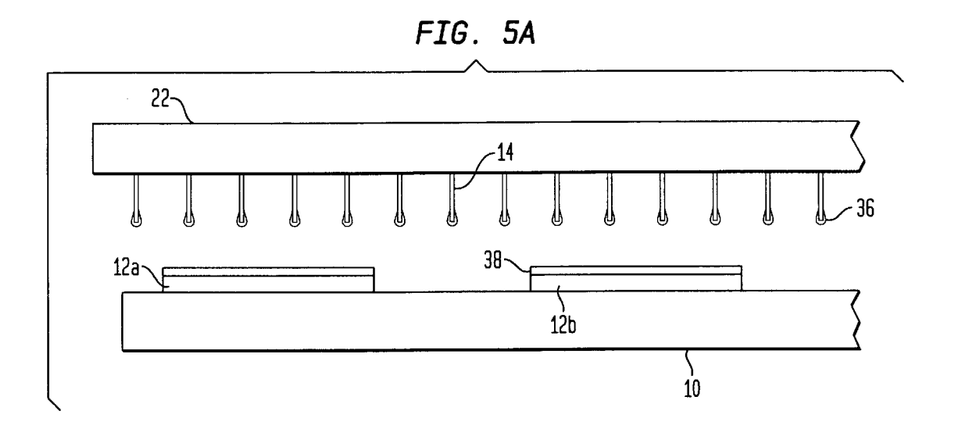
FIGS. 5A–5E schematically illustrate an exemplary process for attaching nanowires to a substrate and making vertical interconnections.

FIGS. 5A through 5E schematically illustrate an exemplary process for attaching nanowires to a substrate and making vertical interconnections. As illustrated in FIG. 5A, the dissolvable substrate 22 having substantially equal length nanowires 14 coated with a metallic solderable coating is placed upside down. A circuit substrate 10 having contact pads 12a, 12b thereon is placed facing the nanowires. The material used for making the contact pads can be selected from a number of different conductive materials, for example, those commonly used in semiconductor circuit fabrication, e.g., Al, Cu, W, Ta, TiN, TaN, CoSi$_2$, with an optional use of additional surface conductive coating. The contact pads also preferably are coated with a solderable layer 38. The contact pads 12a, 12b, etc., typically are less than 25 microns square in area, preferably less than 1 micron square in area, and even more preferably less than 0.01 microns square in area.

Figure 5B:
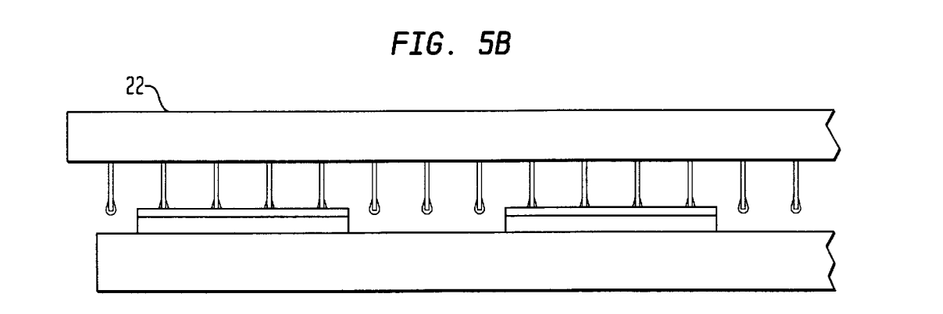

In FIG. 5B, the nanowires are in physical contact with the contact pads, and the structure is heated to induce solder bonding of the nanowires onto the pads. If the nanowires are not sufficiently strong to support the dissolvable substrate (e.g., against the force of gravity), spacers having a desired thickness may be used to prevent collapse of, or damage to, the nanowires by the weight of the substrate. The spacers may comprise a pre-deposited patterned thin film on the circuit substrate 10. The distribution of the nanowires 14 on the dissolvable layer 22 can be patterned so that it will match the location of the contact pads. This can be accomplished, for example, by lithographically patterning the catalytic nucleation layer 26 (FIG. 2) for growth of the nanowires during CVD processing.

Figure 5C:
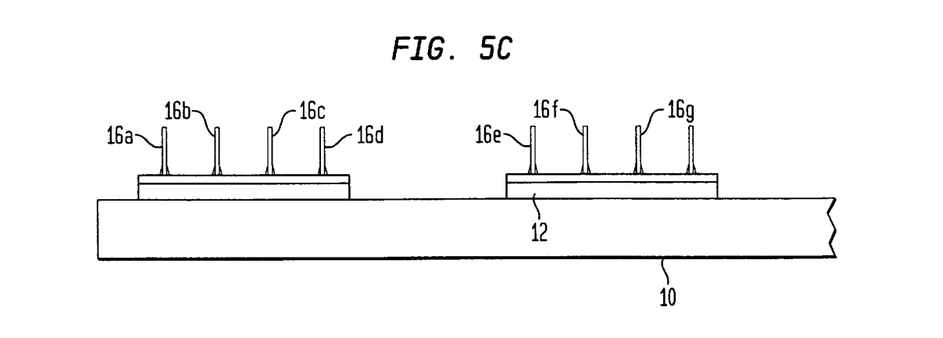
Figure 5D:
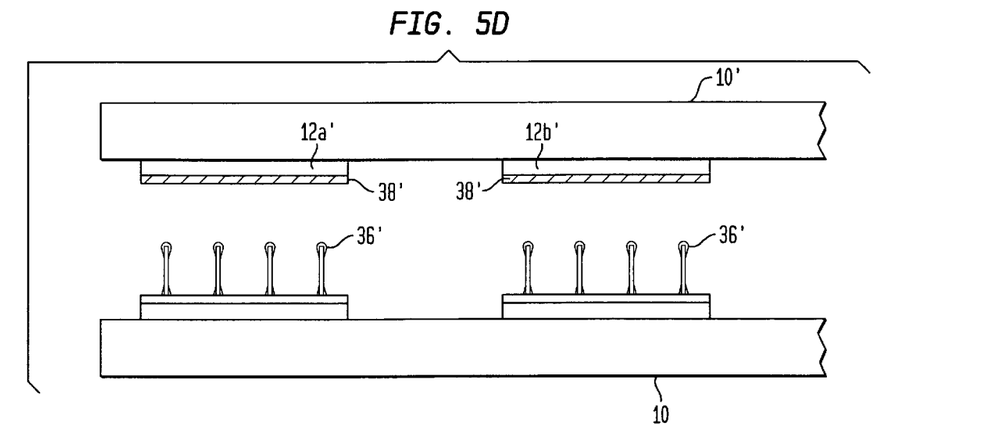
Figure 5E:
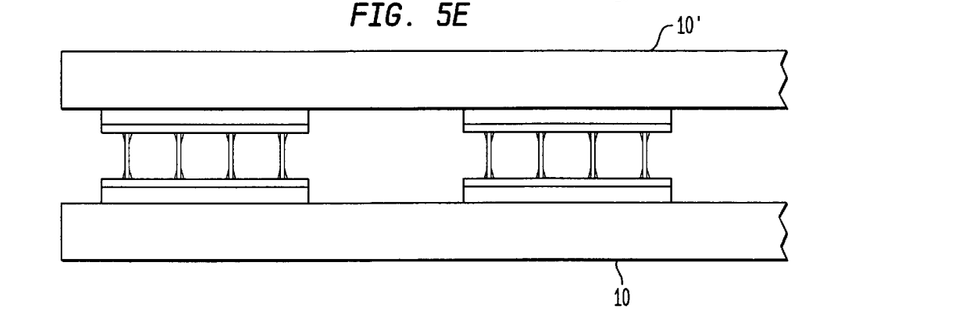

In FIG. 5C, the dissolvable substrate 22 and also, if present, the catalytic nucleation layer 26, have been removed so that the nanowires are bonded to the circuit substrate 10 with their top portions 16a, 16b, 16c, etc., exposed. The nanowires may be further coated with a soldering material, e.g., as described earlier in connection with FIGS. 4A through 4C, so that their top exposed portions are again coated with solder 36', as shown in FIG. 5D. A mating device is provided, comprising a circuit substrate 10' with contact pads 12a' 12b' (FIG. 5D), and a layer of solder material 38' may be placed on the contact pads 12a', 12b.' The mating substrate 10' is placed in contact with the exposed nanowires, e.g. by the circuit device being placed upside down. The structure is then heated so the components are soldered together to complete the vertical interconnection, as shown in FIG. 5E. Spacers or micro-positioning device holders (not shown) may be placed on either or both circuit substrates 10, 10', for use in vertically positioning the devices prior to solder bonding.

The solder material 36', 38', used for bonding the upper device 10' to the top portions 16a, 16b, 16c, of the nanowires may be the same material used in bonding the lower device 10 to the bottom portions of the nanowires (e.g., 36, 38). In that case, the lower solder bonds will undergo the melting and solidification process at least a second time. Alternatively, a first solder material is used to bond the lower device, and a second solder material having a lower soldering temperature is used to bond the upper device. In this way, the lower bonds will not undergo the melting and solidification process when the upper bonds are formed. For example, for the lower device, the solder 36, 38 may comprise a Au—Sn eutectic solder (e.g., having a melting point of about 280° C.), while for the upper device, the solder 36', 38' may comprise a Sn—Ag eutectic solder (e.g., having a melting temperature of about 215° C.). Alternatively, the first soldering material 36, 38 for the lower device may comprise a Pb—Sn eutectic solder (having a melting temperature of about 183° C.), while the second soldering material 36', 38' for the upper device comprises a Bi—Sn eutectic solder (e.g., having a melting temperature of about 139° C.). A multi-layer vertical interconnection of devices also may be carried out using different solders with a hierarchy of melting points. Additionally, the soldering materials optionally may contain one or more carbide forming elements to improve the interface bonding between the solder and the nanowire or circuit pad surface.

The nanowires used in making the vertical interconnections preferably have small dimensions. The diameter of each nanowire is typically less than about 200 nm, preferably less than 50 nm, and even more preferably less than 10 nm. The height of each connection, or the length of each nanowire, is typically in the range of about 10 to 1000 nm. The length of the nanowires desirably is at least 10 nm, preferably at least 100 nm, and even more preferably at least 1000 nm so that they are sufficiently long and thin to achieve a high aspect ratio and mechanical compliancy. However, there are constraints to lengthening the nanowires too much. The longer the nanowires, the more difficult it is to maintain electrical properties over their length (particularly in the case of carbon nanotubes), or to maintain the vertical alignment. Also, a longer nanowire translates to a longer process, e.g., the growth must continue for a longer period of time to achieve the extended length. An upper limit for the nanowire length typically may be less than 100 micrometers, more preferably less than 20 micrometers, and even more preferably less than 2 micrometers.

Figure 6:
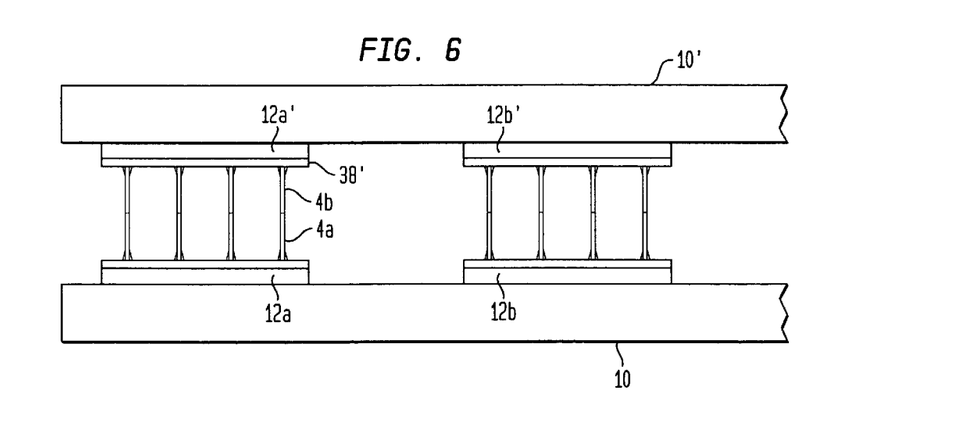
FIG. 6 schematically shows a vertically interconnected device using composite nanowires.

The nanowires used for the vertically-interconnected structures can also possess device characteristics in themselves, i.e., besides straight-forward electrical conduction. For example, a composite nanowire may have at least one heterojunction present along the length of the nanowire. It is known that a silicon semiconductor nanowire can be grown onto the end of a metallic carbon nanotube, or vice versa. See, e.g., J. Hu et al., NATURE Vol. 399 (1999), at p. 48. The metal-semiconductor heterojunction can be integrated into one or more of the nanowires to serve as a rectifying diode device. Other types of devices such as p-n junctions or tunneling device structures also may be incorporated into the nanowires. FIG. 6 schematically illustrates an interconnected device where the nanowires themselves comprise composites of metallic carbon nanotubes 4a and semiconductor wires 4b. A lower circuit substrate 10 has contact pads thereon 12a, 12b, and the nanowires are bonded thereto at portions thereof comprising carbon nanotubes 4a. An upper circuit substrate 10' has contact pads thereon 12a', 12b', and the upper part of the nanowires 4b comprising semiconductor wires are bonded to these upper contact pads 12a', 12b.' These composite nanowires may be grown in an aligned parallel fashion on a dissolvable substrate and their lengths equalized, as described above, and they may be solder bonded to the substrates 10, 10', also as described above. An array structure can be used for a high-density assembly of such devices.

It is understood that the embodiments described herein are merely exemplary and that a person skilled in the art may make many variations and modifications without departing from the spirit and scope of the invention. For example, instead of using a dissolvable substrate for the initial growth of nanowires, one could use a non-dissolvable substrate or a dissolvable substrate without resorting to the dissolution approach during subsequent processing. The substrate can be mechanically pulled away and separated from nanowires at one set of ends while the other ends are strongly bonded onto the desired circuit pad, e.g., by solder bonding. When this alternative approach is used, the bond-strength at the substrate-nanowire interface should be substantially lower than that at the nanowire-pad interface. For example, carbon nanotubes grown on a quartz substrate will have a relatively weak bond strength and can be easily separated from the substrate by use of a weak mechanical force. All such variations and modifications are intended to be included within the scope of the appended claims.

We claim:

1. A method of making a circuit device comprising:

providing a substrate;

growing a plurality of spaced-apart carbon nanotubes attached on the substrate so that each one of the plurality of nanotubes has a first exposed end and a second end attached to the substrate;

while the nanotubes are attached to the substrate, equalizing the length of the nanotubes so that each one of the plurality of nanotubes is substantially equal in length with a length variation of less than 20%;

bonding the resulting exposed ends of the plurality of nanotubes to a first circuit layer; and removing the substrate to provide a circuit device having the plurality of nanotubes bonded to the first circuit layer with the second ends of the plurality of nanotubes exposed.

2. The method of claim 1, wherein the step of removing the substrate comprises mechanically detaching the second ends of the plurality of nanotubes from the substrate.

3. The method of claim 1 wherein the substrate comprises a dissolvable substrate and the step of removing the substrate comprises chemically dissolving the substrate.

4. The method of claim 1 further comprising the steps of providing a second circuit layer, coating the second exposed ends of the plurality of nanotubes with a second soldering material, and bonding the second exposed ends to the second circuit layer to provide a vertically-interconnected circuit device.

5. A method of making a circuit device comprising:

providing a dissolvable substrate growing a plurality of nanowires on the substrate so that each one of the plurality of nanowires has a first exposed end and a second end attached to the substrate, said growing the plurality of nanowires comprises depositing a catalytic nucleation layer on the dissolvable substrate and decomposing a gas adjacent the catalytic nucleation layer;

equalizing the length of the nanowires so that each one of the plurality of nanowires is substantially equal in length;

bonding the resulting exposed ends of the plurality of nanowires to a first circuit layer; and removing the substrate to provide a circuit device having a plurality of nanowires bonded to the first circuit layer with the second ends of the plurality of nanowires exposed.

6. The method of claim 5 in which the gas comprises a hydrocarbon-containing gas such that carbon nanotubes are grown on the dissolvable substrate.

7. The method of claim 1 further comprising the step of coating at least one of the exposed ends of the plurality of nanowires with a soldering material.

8. The method of claim 7 in which the soldering material is applied to at least one of the exposed ends of the plurality of nanowires by a deposition process during which the dissolvable substrate is rotated to promote a uniform application of the soldering material on the plurality of nanowires.

9. The method of claim 7 in which the first and second circuit layers each has a plurality of contact pads thereon, a layer of soldering material is applied to each of the contact pads on the resulting exposed ends and second circuit layer, and the first and second ends of the plurality of nanowires are bonded onto the contact pads.

10. The method of claim 9, in which the first soldering material used to bond the first exposed ends to the first circuit layer has a first soldering temperature and the second soldering material used to bond the second exposed ends to the second circuit layer has a second soldering temperature, in which the second soldering temperature is lower than the first soldering temperature.

11. The method of claim 1, in which the step of equalizing the length of the nanowires comprises:

partially embedding the plurality of nanowires attached to the dissolvable substrate in a layer of sacrificial material of substantially uniform thickness whereby an extra length of nanowires protrudes from the sacrificial material;

removing the extra length of nanowires; and removing the sacrificial material.

12. The method of claim 11, further comprising a conductive underlayer interposed between the dissolvable substrate and the catalytic nucleation layer for use in enhancing adherence of the layer of sacrificial material to the dissolvable substrate.

13. The method of claim 11, in which the sacrificial material is deposited by electroplating.

14. The method of claim 11, in which the thickness of the layer of sacrificial material is in the range of about 1 to 100 micrometers.

* * * * *